(12) United States Patent
Werner

(10) Patent No.: US 7,582,922 B2
(45) Date of Patent: Sep. 1, 2009

(54) SEMICONDUCTOR DEVICE

(75) Inventor: Wolfgang Werner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 45 days.

(21) Appl. No.: 11/944,717

(22) Filed: Nov. 26, 2007

(65) Prior Publication Data
US 2009/0134434 A1 May 28, 2009

(51) Int. Cl.
*H01L 31/112* (2006.01)
(52) U.S. Cl. .................. 257/274; 257/134; 257/256; 257/654
(58) Field of Classification Search .................. 257/44, 257/134, 135, 256, 272, 274, 654, E33.045, 257/E27.069
See application file for complete search history.

(56) References Cited
U.S. PATENT DOCUMENTS
4,800,172 A * 1/1989 Okano et al. ............... 438/195
5,327,374 A * 7/1994 Krautschneider et al. ... 365/149
5,557,125 A * 9/1996 Shibib ....................... 257/329
6,573,534 B1 * 6/2003 Kumar et al. ................ 257/77
2003/0057479 A1 * 3/2003 Ahlers et al. ............... 257/328
2007/0284628 A1 * 12/2007 Kapoor ...................... 257/270
2008/0014687 A1 * 1/2008 Vora et al. .................. 438/186

FOREIGN PATENT DOCUMENTS
DE    10 2005 047 054 A1    4/2007

* cited by examiner

Primary Examiner—Fernando L Toledo
(74) Attorney, Agent, or Firm—Dicke, Billig & Czaja, PLLC

(57) ABSTRACT

A semiconductor device is disclosed. One embodiment provides a top surface. A first lateral semiconductor region is arranged adjacent to the top surface and includes a transistor structure. The transistor structure includes a drain zone of a first conductivity type. A second lateral semiconductor region is arranged below the first semiconductor region and includes a junction field-effect transistor structure. The junction field-effect transistor structure includes a source zone of the first conductivity type which is electrically connected to the drain zone of the transistor structure.

18 Claims, 12 Drawing Sheets

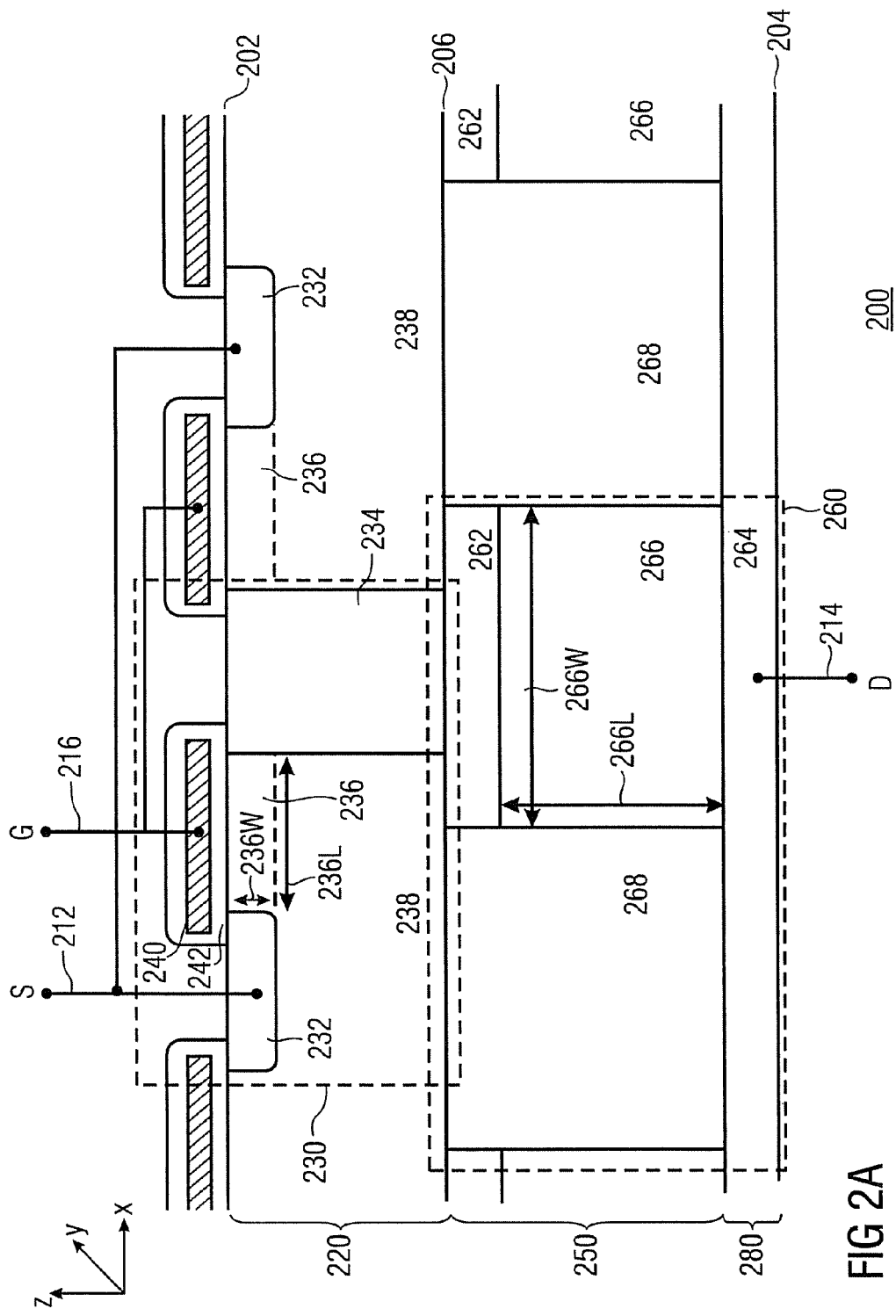

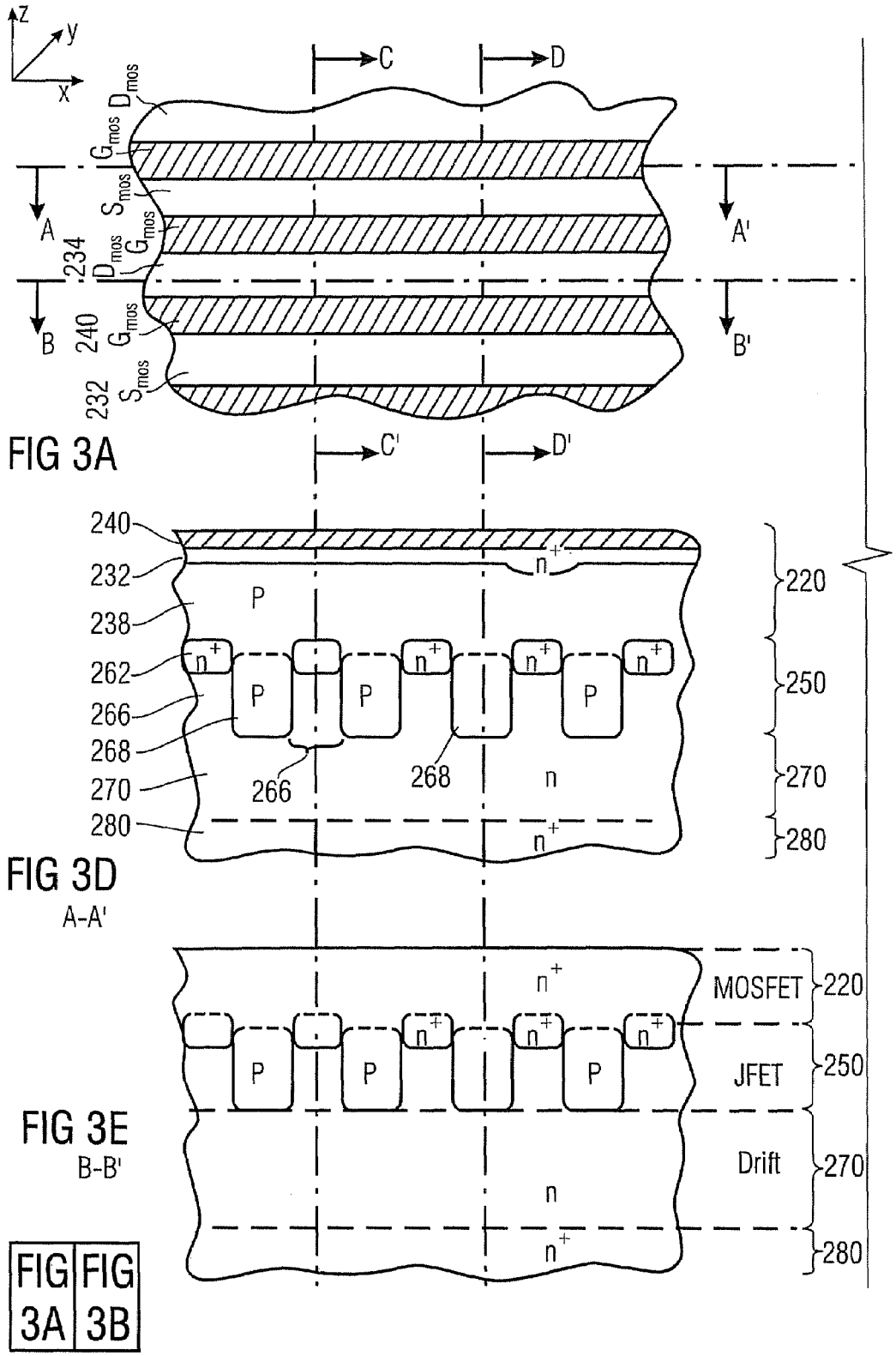

C-C'

D-D'

SEMICONDUCTOR DEVICE

BACKGROUND

One or more embodiments of the invention relates to a semiconductor device, for example, to a power semiconductor device.

DMOS (Double Diffusion Metal Oxide Semiconductor) transistors are employed as power semiconductor devices. In DMOS transistors, the on-state resistance of the entire DMOS transistor is determined among other things by the resistance component of the MOS (Metal Oxide Semiconductor) switch. In certain semiconductor materials, like for example silicon (Si), the resistance component of the MOS switch can frequently be neglected in relation to other resistance components of the DMOS transistor, however, frequently cannot be neglected in other semiconductor materials, like for example silicon carbide (SiC).

SUMMARY

One embodiment provides a semiconductor device including a top surface;
a first lateral semiconductor region positioned adjacent to the top surface and including a transistor structure. The transistor structure includes a drain zone of a first conductivity type. A second lateral semiconductor region arranged below the first semiconductor region and includes a barrier layer or junction field-effect transistor structure. The junction field-effect transistor structure includes a source zone of the first conductivity type electrically connected to the drain zone of the transistor structure.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2A illustrates a cross section of a first embodiment of a semiconductor device including a first lateral semiconductor region and an underlying second lateral semiconductor region, wherein a MOS field-effect transistor structure is arranged in the first semiconductor region and a junction field-effect transistor structure is arranged in the second semiconductor region, and wherein a drain zone of the MOS field-effect transistor structure is electrically connected to a source zone of the junction field-effect transistor structure.

FIG. 3A illustrates a top view of an embodiment of the semiconductor device including gate, source and drain zones arranged next to one another in the shape of stripes.

FIG. 3D illustrates a longitudinal section A-A' of the embodiment of FIG. 3A.

FIG. 3E illustrates a second longitudinal section B-B' of the embodiment of FIG. 3A.

DETAILED DESCRIPTION

Figure 1A:
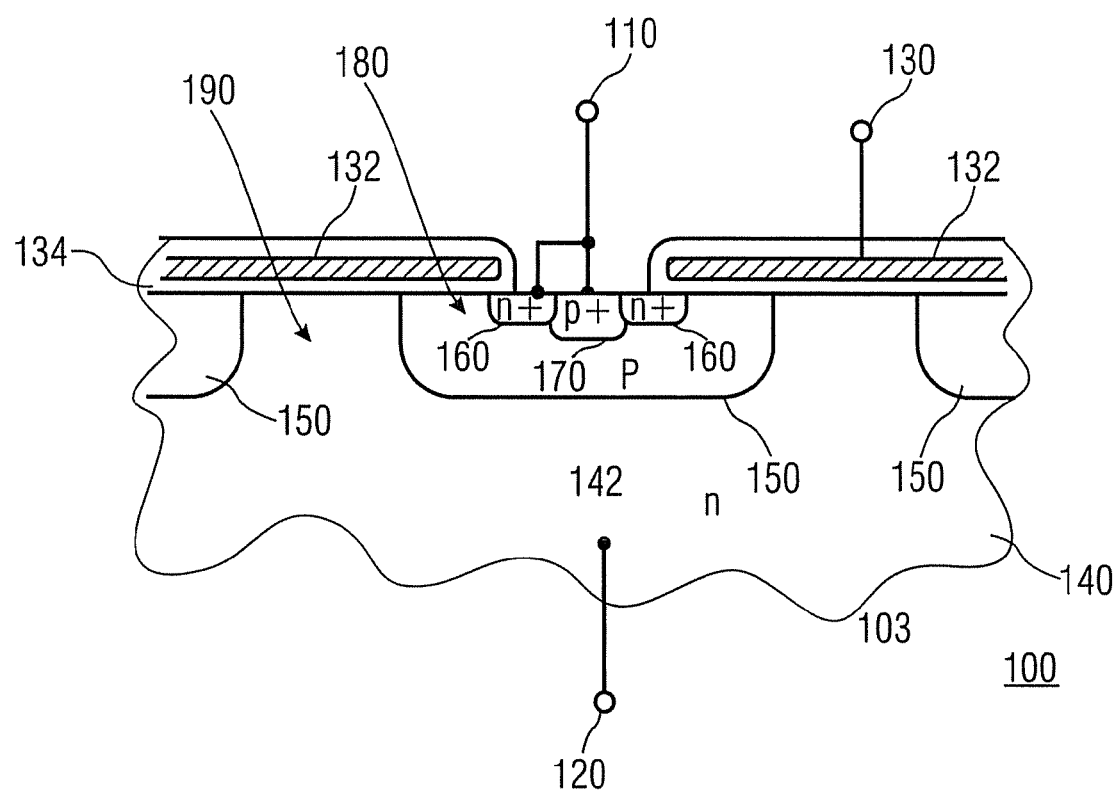
FIG. 1A illustrates a cross section of a DMOS transistor.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the present application, same reference numerals are used for objects and functional units having same or functionally similar characteristics. In this context, it is pointed out that, on the one hand, unless explicitly indicated otherwise, parts relating to objects having similar or same functional characteristics among the descriptions of the different embodiments are interchangeable. On the other hand, it is pointed out that by commonly using a reference numeral for an object occurring in more than one embodiment, nothing is stated as to whether they have identical features and characteristics in the different embodiments or the corresponding embodiments. Thus, same or similar reference numerals do not imply a special design and dimensioning.

The abbreviation FET is used for the term field-effect transistor, so that the MOS field-effect transistor is also referred to as MOSFET and the junction field-effect transistor is also referred to as junction FET for which the abbreviation JFET (Junction FET; Junction=p-n Junction) is used.

Field-effect transistors are typically described by their breakdown voltages and on-state resistances.

The breakdown voltage is defined as that voltage in the off state where the transistor "breaks down" or is destroyed. The breakdown voltage determines the maximum off-state voltage of the transistor. The terms "switched-off state" or "blocking state and/or operation" are also used instead of the term "off-state".

The on-state resistance is defined as the resistance of the transistor in the on state. The terms conducting state and/or operation are also used for the term on state and the terms conducting resistance or drain-source on-state resistance are used for the term on-state resistance.

FIG. 1A illustrates a DMOS transistor 100 including a source terminal 110, a drain terminal 120 and a gate terminal 130. The DMOS transistor 100 includes a substrate 140 in which p-wells 150 are arranged in which in turn n$^+$-zones 160 or source zones 160 and a p$^+$-zone 170 are arranged. Thus, the p-well 150 forms the bulk region for the MOS component 180. The source zone 160 is electrically connected to the source terminal 110. The bulk zone 150 is also electrically connected to the source terminal 110 via the p$^+$-zone. The junction field-effect transistor component 190 of the DMOS transistor is located between the bulk zones 150. The gate electrodes 132 are arranged above the MOS field-effect transistor component 180 and the junction field-effect transistor component 190 and electrically insulated therefrom by an insulation layer 134.

The mode of functioning of the DMOS transistor 100 will be described in greater detail below referring to FIGS. 1B and 1C.

Figure 1B:
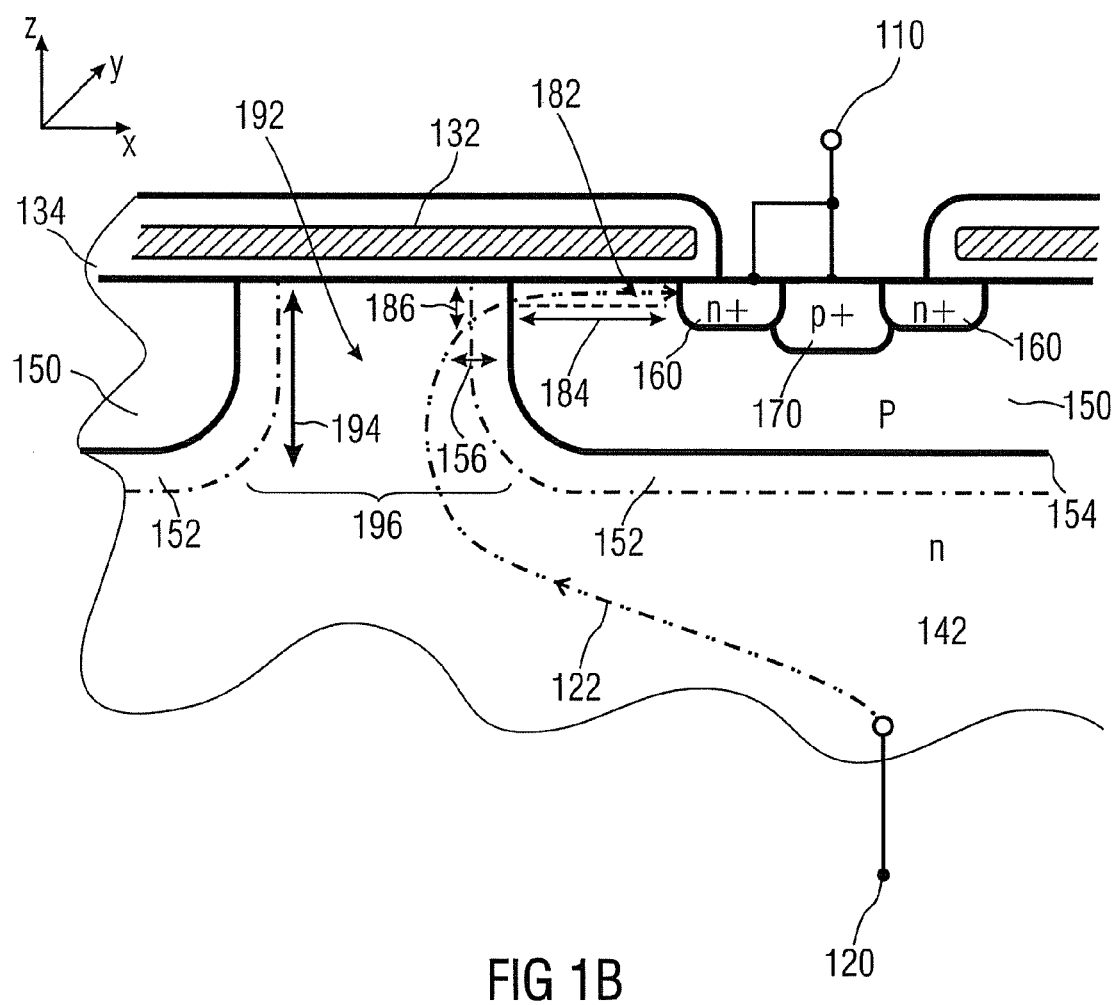
FIG. 1B illustrates the channel zones of the DMOS transistor of FIG. 1A.

FIG. 1B illustrates a part of a cross section of a DMOS transistor of FIG. 1A by additionally marking the channel zone 182 (broken line) of the MOS field-effect transistor component 180, the channel zone 192 (broken line) of the junction field-effect transistor component 190 and a blocking layer or depletion zone 152 (dot-dash line). The channel zone 182 of the MOS field-effect transistor component is located laterally between the source zone 160 and the channel zone 192 of the junction field-effect transistor component.

The length of the lateral channel 182 in the x direction is referred to by reference numeral 184, the width of the channel 182 in the z direction by 186, whereas the extension of the channel 182 in the y direction is not illustrated in FIG. 1B. The vertical channel 192 of the junction field-effect transistor component 190 is located vertically between the bulk zones 150. The length of the channel 122 in the z direction in FIG. 1B is referred to by the reference numeral 194, the width of the channel 192 in the x direction by the reference numeral 196, whereas the extension of the channel 192 in the y direction is not illustrated in FIG. 1B.

If the p-n junction 154 is operated in reverse direction, a depletion zone 152 (dot-dash line) will form which within an increasing extension reduces the channel cross section of the channel 192 of the junction field-effect transistor component and thus increases the resistance component of the junction field-effect transistor component 190 (see arrow 156).

The reference numeral 122 illustrates the current flow (double-dot-dash line) of the DMOS transistor in the on state from the drain terminal 120 through the substrate or drift zone 140, the channel 192, the channel 182 to the source zone 160 and/or the source terminal 110.

Figure 1C:
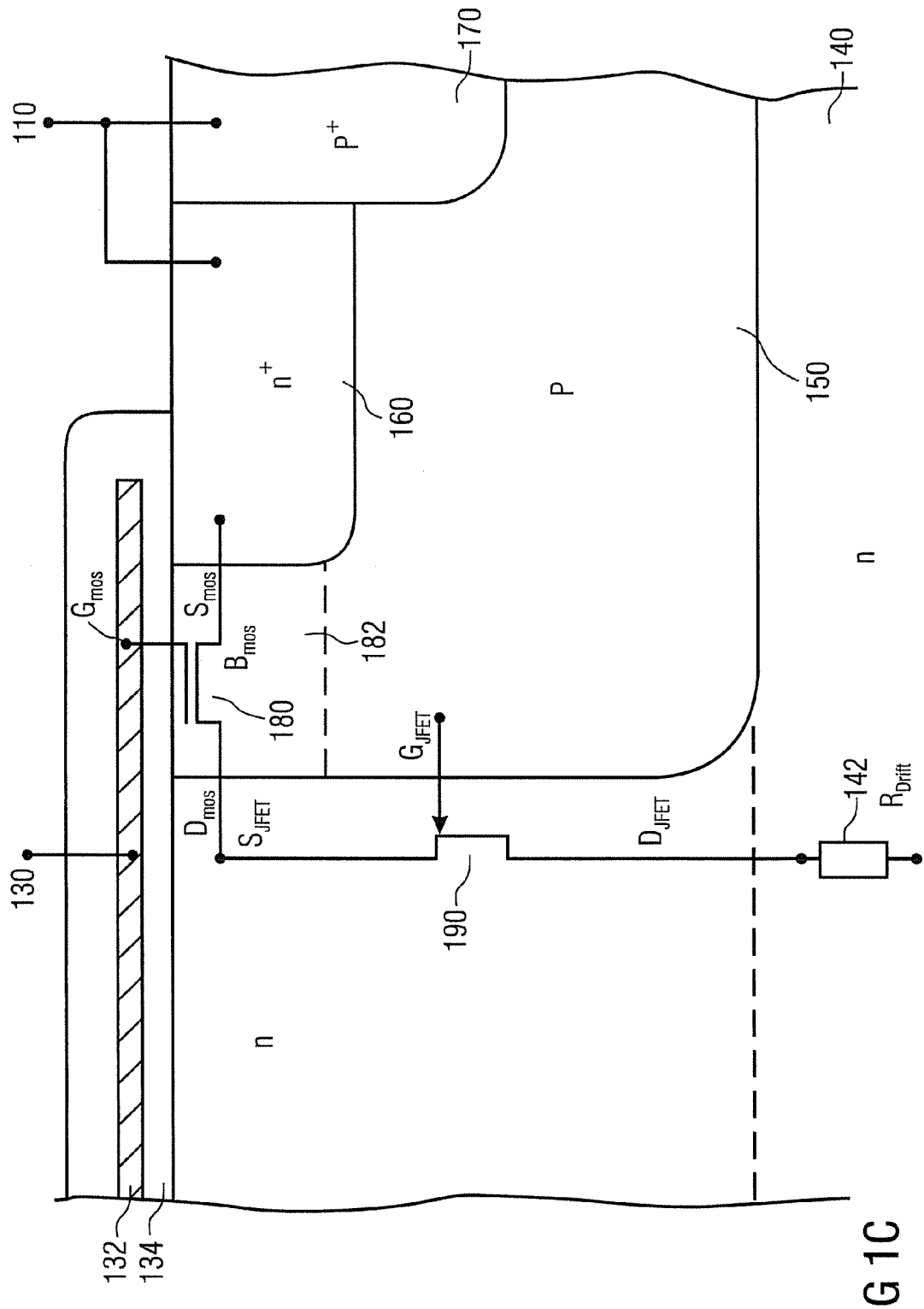
FIG. 1C illustrates a part of the DMOS transistor of FIGS. 1A and 1B including the corresponding circuit symbols of the elements of the DMOS transistor which influence the characteristics of the DMOS transistor.

FIG. 1C illustrates a part of one embodiment of FIGS. 1A and 1B and the corresponding circuit symbols of the transistor and resistor components which essentially influence the current and voltage performance of the DMOS transistor.

In more detail, FIG. 1C illustrates the MOS field-effect transistor component 180, the junction field-effect transistor component 190 and the drift distance component 142. The MOS field-effect transistor component 180 includes a source $S_{MOS}$, a drain $D_{MOS}$, a gate $G_{MOS}$ and a bulk $B_{MOS}$. The source $S_{MOS}$ is formed by then n$^+$-doped source zone 160, the gate $G_{MOS}$ is formed by the gate electrode 132, the drain $D_{MOS}$ is formed by the n-doped region between the bulk zones 150 and the bulk $B_{MOS}$ is formed by the p-doped bulk zone 150. Correspondingly, the MOS field-effect transistor component of FIG. 1C is implemented as an enhancement-type or enhancement n-channel MOS field-effect transistor component. The junction field-effect transistor component 190 (JFET) includes a source $S_{JFET}$, a drain $D_{JFET}$ and a gate $G_{JFET}$. The source $S_{JFET}$ is formed by the n-doped upper region between the p-doped bulk zones 150 and the drain $D_{JFET}$ is formed by the lower region between the p-doped bulk zones 150. The upper region between the bulk zones 150 and/or the upper region of the channel 192 form both the drain $D_{MOS}$ of the MOS field-effect transistor component and the source $S_{JFET}$ of the junction field-effect transistor component. The gate $G_{JFET}$ is formed by the p-doped bulk zone 150. Correspondingly, an n-channel junction field-effect transistor component is illustrated in FIG. 1C. The electrical performance of the drift distance can be described by a drift resistance component $R_{drift}$.

The MOS field-effect transistor components 180, the junction field-effect transistor components 190 and the resistance components of the drift zone 142 and/or the circuit symbols thereof are connected in series and describe the voltage and current behavior in the off state and in the on state. In the on state, the on-state resistance of the DMOS transistor is basically determined by the resistance components of the drift distance ($R_{drift}$), the junction field-effect transistor 190 and the MOS field-effect transistor component 180.

As explained before, the channel 192 is, depending on the voltage at the p-n junction 154, restricted by the depletion zone 152 to a greater or lesser extent and, in an extreme case, even pinched off, which means that the resistance of the junction field-effect transistor component 190 becomes infinitely great and there is no more current flowing.

In order to protect the MOS field-effect transistor component 180 from breakdown in the off state, the junction field-effect transistor component 190 may exemplarily be implemented such that it pinches off the channel 192, which means blocks same, before the channel 182 of the MOS field-effect transistor component 180 breaks down. In other words, the $D_{MOS}$ transistor can be dimensioned such that the pinch-off voltage $V_P$ of the junction field-effect transistor component 190 is smaller than the breakdown voltage $V_{BR}$ of the MOS field-effect transistor component 180, which means: $V_{P\text{-}JFET} < V_{BR\text{-}MOS}$. This can be achieved by correspondingly dimensioning the channel lengths and widths of the two channels 182, 192, and by correspondingly doping the semiconductor zones involved.

In order for the channel resistance of the junction field-effect transistor component in the on state to remain small, the channel width 196 is dimensioned to be correspondingly great, considering the depletion zone. Conversely, this means that in this case the channel length 184 is also dimensioned to be correspondingly great in order for the MOS field-effect transistor component 180 in the off state to include a corresponding dielectric strength.

This mutual dependence of the channel dimensions (channel length/width) limits the possibilities of dimensioning the individual field-effect transistor components or the dimensions of the respective channels, in one embodiment when further reducing the channel dimensions to achieve a higher packing density which is typically indicated as channel width per unit area.

This mutual dependence of the junction field-effect transistor component and the MOS field-effect transistor component and/or the respective channels will result irrespective of the semiconductor material used when designing such a DMOS.

When silicon is used as the semiconductor material, the resistance components of the MOS field-effect transistor component 180 and the junction field-effect transistor component 190 in relation to the resistance component of the drift distance 142 can be neglected frequently in the on state. In a semiconductor device design on the basis of silicon, the characteristics of the drift zone are primarily selected and/or the drift zone dimensioned and doped relative to the other regions such that a certain breakdown voltage of the $D_{MOS}$ transistor in the off state can be achieved.

As an alternative to the semiconductor material of silicon in power semiconductor devices, silicon carbide (SiC) is increasingly used, wherein the manufacturing processes of silicon technology can be adopted here. Compared to silicon, silicon carbide includes greater a band gap. The greater band gap of silicon carbide results in a higher specific breakdown voltage and/or allows a considerably higher off-state voltage at equal device structures. This increased blocking capability, however, can also be used for thinner semiconductor blocking layers and/or thinner drift zones in the device, thereby compensating the somewhat poorer electron drift speed of silicon carbide compared to silicon. Additionally, the thin semiconductor layers, in the on state, allow lower conducting resistances or on-state resistances which in turn reduces static losses.

In a $D_{MOS}$ transistor based on silicon carbide technology, with a thinner and/or shorter drift distance compared to a corresponding $D_{MOS}$ transistor based on silicon technology, a $D_{MOS}$ with reduced resistance component of the drift distance may be realized—due to the shorter drift distance. At the same time, the resistance component of the junction field-effect transistor component 190 increases—due to the smaller electron drift speed and/or channel mobility, but in one embodiment the resistance component of the MOS field-effect transistor component 180 increases compared to a $D_{MOS}$ transistor based on silicon so that the resistance component of the MOS field-effect transistor component in the on state is typically gaining in influence.

Thus, the dimensioning of the channel dimensions of the MOS field-effect transistor component 180 and maybe, due to the mutual dependence discussed before, the dimensioning of the junction field-effect transistor component 190 are gaining in importance compared to the dimensioning of the drift zone.

FIG. 2A illustrates a cross section of an embodiment of a semiconductor device 200 including a top surface 202, a bottom surface 204 opposite the top surface, a source terminal 212, a drain terminal 214 and a gate terminal 216, a first semiconductor region 220, a second semiconductor region 250 and a drain region 280.

The first semiconductor region 220 is a lateral semiconductor region 220 adjacent to the top surface 202 and including a MOS field-effect transistor structure 230. The MOS field-effect transistor structure 230 includes at least one source zone 232 of a first conductivity type, at least one drain zone 234 of the first conductivity type, at least one channel zone 236 and at least one bulk zone of a second conductivity type inverse to the first conductivity type. In the embodiment illustrated in FIG. 2A, the bulk zone 238 extends into the channel zone 236 so that the channel zone 236 also has a second conductivity type, and the MOS field-effect transistor structure is an enhancement MOS field-effect transistor structure. In alternative embodiments, the channel zone 236 may also include a first conductivity type so that the MOS field-effect transistor structure can be a depletion-type or depletion MOS field-effect transistor structure. Above the channel zone 236, there is a gate zone 240 which is electrically insulated from the channel zone 236 by an insulator 242.

The second semiconductor region is arranged laterally below the first semiconductor region and includes a junction field-effect transistor structure 260. The junction field-effect transistor structure 260 includes at least one source zone 262 of the first conductivity type, at least one drain zone 264 of the first conductivity type, at least one vertical channel 266 of the first conductivity type, and at least one gate zone 268 of the second conductivity type. In the embodiment illustrated in FIG. 2A, the drain zone 264 is formed by the drain region 280.

The drain zone 234 of the MOS field-effect transistor structure 230 is connected electrically to the source zone 262 of the junction field-effect transistor structure 260. In the example illustrated in FIG. 2A, the drain zone 234 and the source zone 262 are directly connected to each other and/or are directly adjacent. In one or more embodiments, the electrical connection may be realized by any conducting connections and/or other layers may be inserted between the first semiconductor region and the second semiconductor region.

The source zone 232 of the MOS field-effect transistor is connected to the source terminal 212 of the semiconductor device 200, the gate zone 240 of the MOS field-effect transistor structure is connected to the gate terminal 216 of the semiconductor device, and the drain zone 234 of the MOS field-effect transistor structure is connected to the drain terminal 214 of the semiconductor device 200 via the channel zone 266.

The channel length in FIG. 2A is referred to by 236L (in x direction), the channel width is referred to by 236W (in z direction). The reference numeral 266L refers to the length of the channel 266 of the junction field-effect transistor structure (in z direction) and the reference numeral 266W refers to the width of the channel in the x direction. The extension of the channels 236 and 266 in the y direction is not illustrated in FIG. 2A.

One or more embodiments of the semiconductor device 200 decouple the field-effect transistor component 230 and the junction field-effect transistor component 260 by arranging both components in two semiconductor regions 220 and 250 arranged one above the other, and thus generally allow independent dimensioning of the channel length/width of the MOS field-effect transistor component and the channel length/width of the junction field-effect transistor component 260 (i.e. irrespective of whether the junction field-effect transistor structure has protective function mentioned before or not). The bulk zone 238 and the channel 236 in the first semiconductor region 220 can be dimensioned independently of the gate zones 268 and the channel zone 266 in the second semiconductor region 250.

In further embodiments of the semiconductor device in which the junction field-effect transistor structure 260 fulfills the protective function for the MOS field-effect transistor structure 220 already discussed referring to FIGS. 1A to 1C, i.e. pinches off the channel 266 of the junction field-effect transistor component 260 in the off state, before the MOS field-effect transistor component 230 "breaks down" ($V_{P\text{-}JFET} < V_{BR\text{-}MOS}$), the channel length 236L of the channel 236 of the MOS field-effect transistor structure 230 can be reduced further and thus a further reduction in the channel length per unit area can be achieved. The pinch-off voltage of the junction field-effect transistor structure 260 here can be set to nearly any value by suitably selecting the channel length 266L, the channel width 266W and/or the ratio of the channel length 260L to the channel width 266W and the corresponding dopings and/or doping concentrations of the gate zones 268 and the channel zones 266, the source zone 262 and the drain zone 264.

One or more embodiments of the semiconductor device may include a lateral MOS field-effect transistor structure 230 and a vertical junction field-effect transistor structure 260, as illustrated in FIG. 2A, or may comprise, e.g., vertical MOS field-effect transistor structures and/or lateral junction field-effect transistor structures, or other alternative structures.

Correspondingly, FIG. 2A generally represents the principle of decoupling and/or the two layers and the field-effect transistor structures contained therein with regard to the dimensioning of the junction field-effect transistor structure 260 illustrated.

Figure 2B:
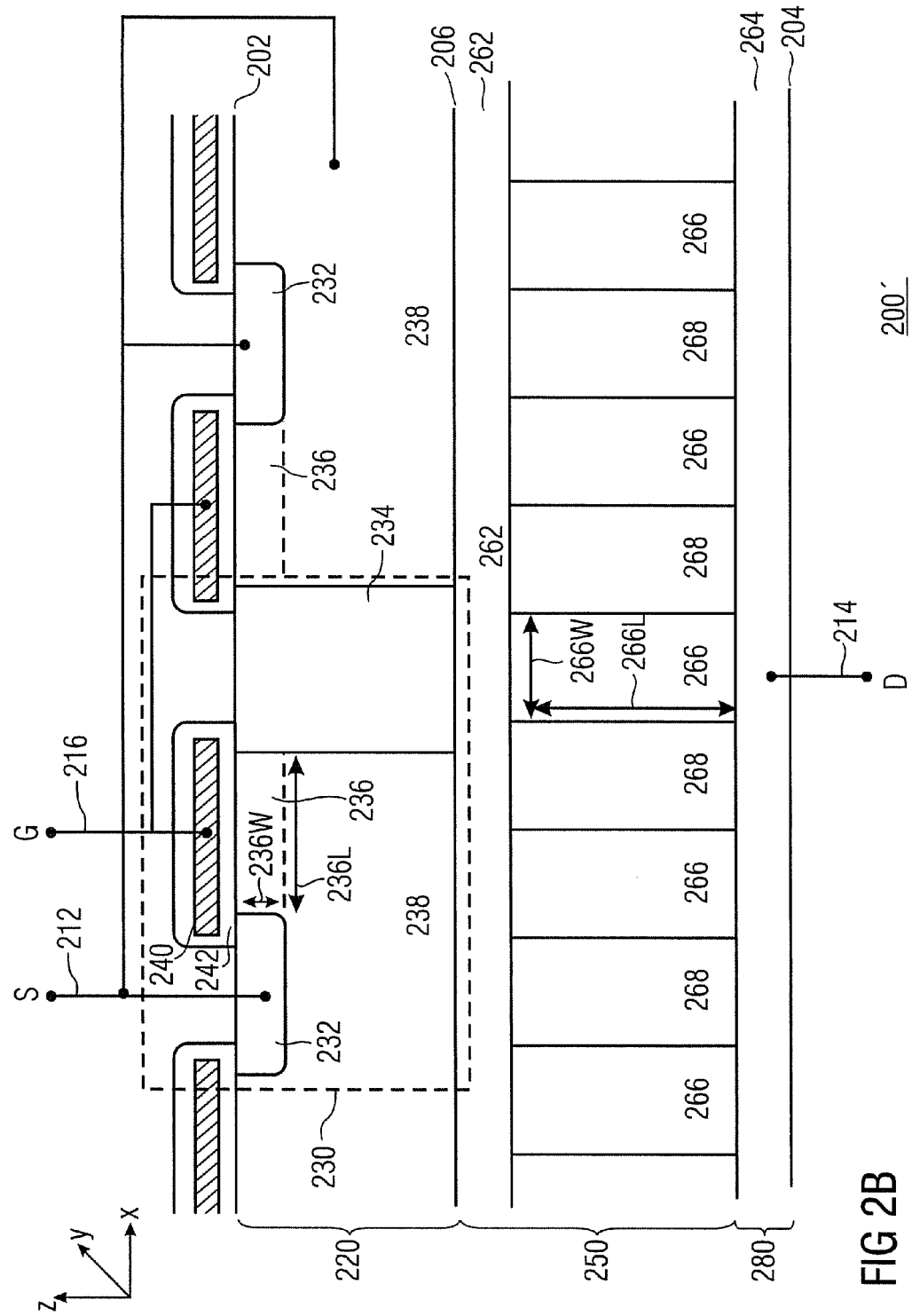
FIG. 2B illustrates a cross section of a second embodiment of a semiconductor device.

As an alternative to the embodiment illustrated in FIG. 2A, the source zone 262 may, for example, extend continuously or nearly continuously at the boundary level 206 between the first and second semiconductor regions, and the gate zones 268 may be arranged to be underlying, as is illustrated in the second embodiment of the semiconductor device 200' in FIG. 2B. This allows a number of channels 266 to be independent of the number of drain zones 234. The gate zones 268 in these embodiments may, for example, be electrically connected to for example the bulk zone 238 in the first semiconductor region by conducting openings in the source zone and/or source zone layer 262 or other conductive connections.

Figure 2C:
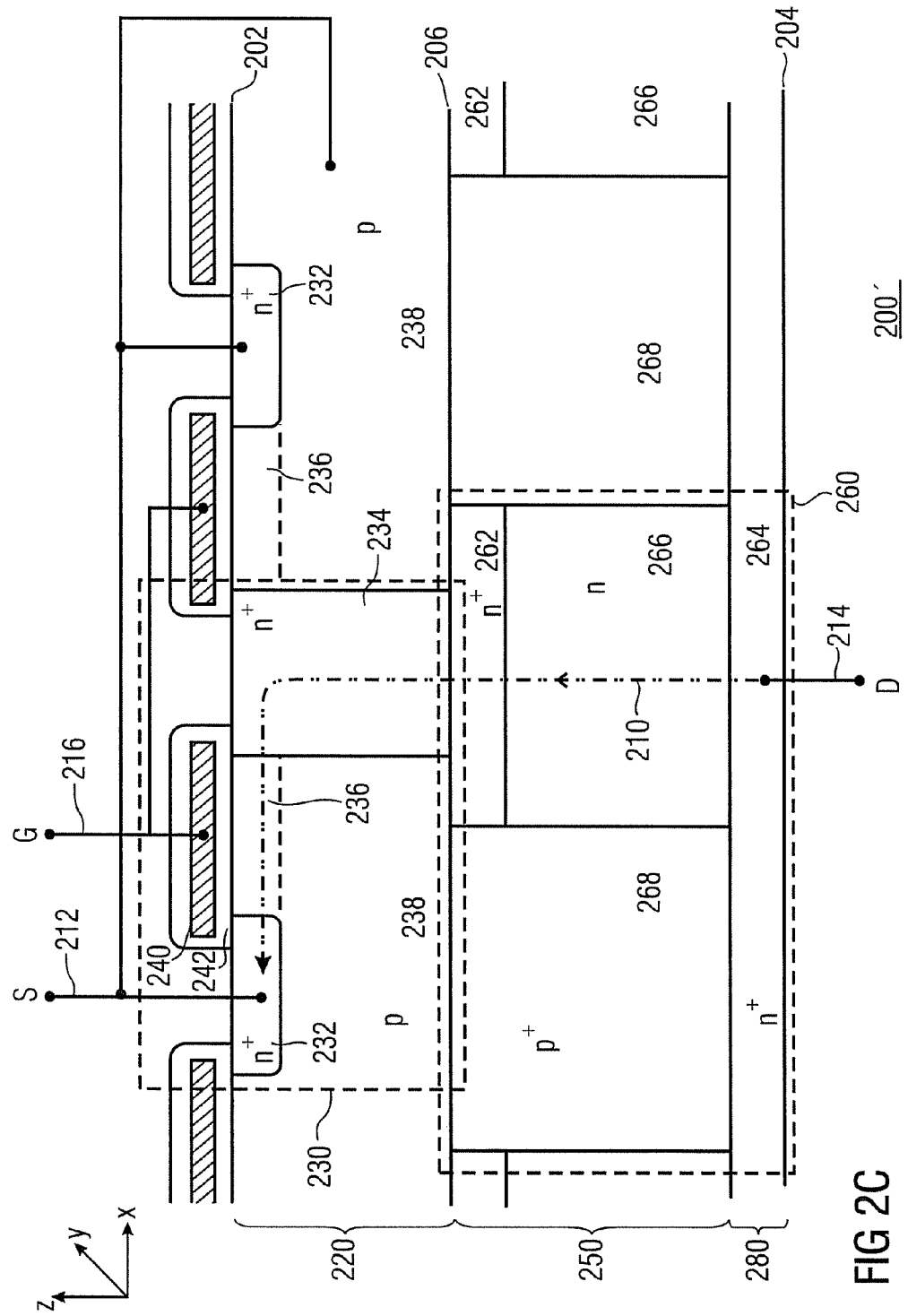
FIG. 2C illustrates the cross section of the first embodiment of the semiconductor device of FIG. 2A, wherein the first conductivity type is an n-type doping and the second conductivity type is a p-type doping.

FIG. 2C illustrates an embodiment of the semiconductor device 200 of FIG. 2A, wherein the first conductivity type generally is an n-type doping and the second conductivity type inverse thereto generally is a p-type doping.

In the embodiment illustrated in FIG. 2C, the source zone 232, the drain zone 234, the source zone 262 and the drain zone 264 or drain region 280 include an n$^+$-type doping, the bulk zone 238 has a p-type doping and the gate zone 268 has a p$^+$-type doping.

Different doping concentrations can be employed in alternative embodiments.

In embodiments of the semiconductor device, the surface charge in the gate zone 268 (here p-zone) is equal to or higher than the double of the breakdown charge. The breakdown charge is about $10^{12}$ (elementary charge) per cm$^2$. The surface charge in the channel zone 266 (here n-zone) is equal to or lower than the double of the breakdown charge.

In the embodiment illustrated in FIG. 2C, the bulk zone 238, as is the source zone 232, is connected to the source terminal 212 of the semiconductor device 200. The current flowing in the on state (drain-source current) is indicated in FIG. 2C by the reference numeral 210 (see double-dot-dash line).

Figure 2D:
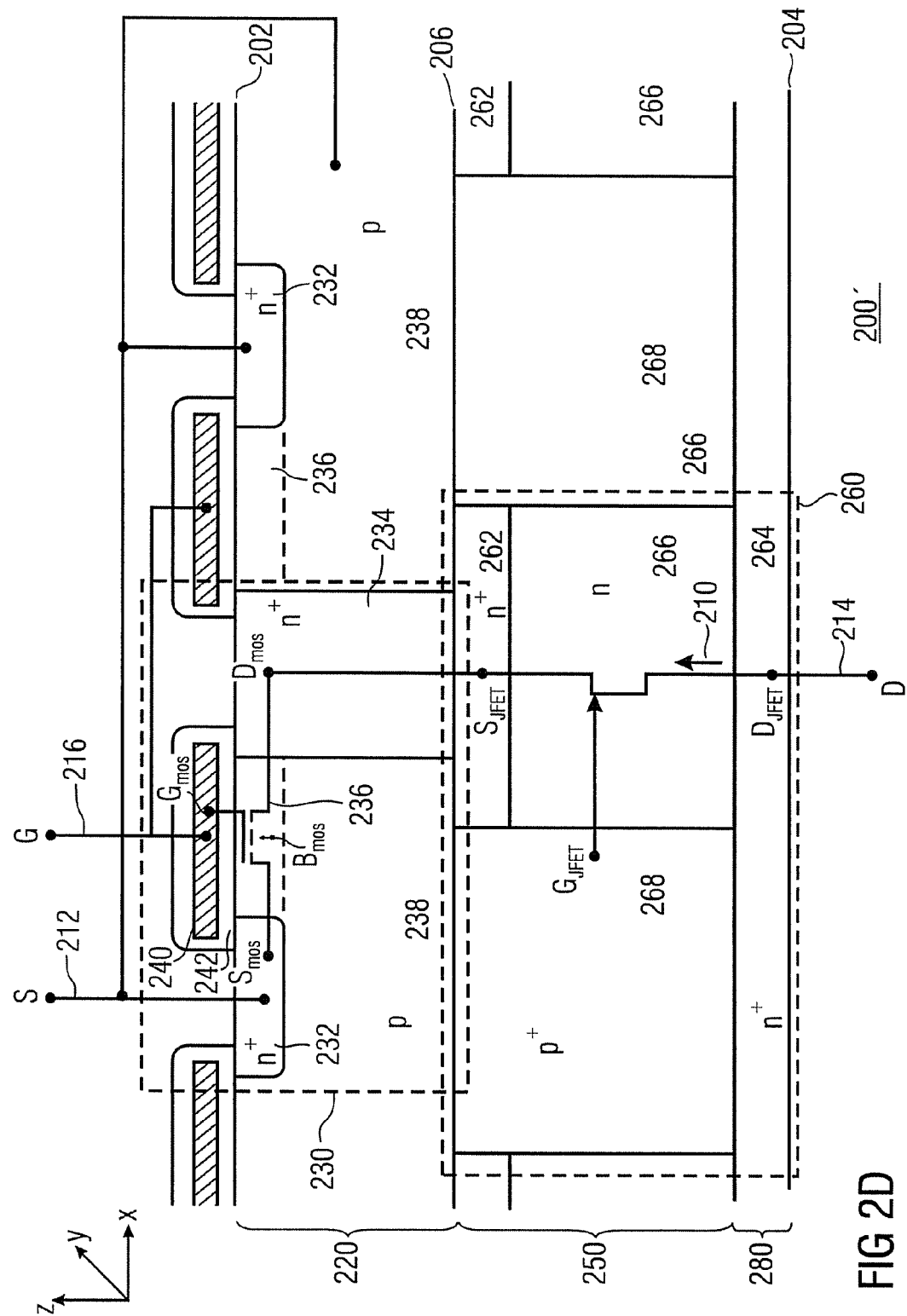
FIG. 2D illustrates the cross section of the first embodiment of the semiconductor device of FIG. 2C and additionally the circuit symbols of the elements which essentially influence the performance of the embodiment.

FIG. 2D illustrates a cross section according to the embodiments of FIGS. 2A and 2B, wherein additionally the circuit symbols for the MOS field-effect transistor structure 230 and the junction field-effect transistor structure 260 and the serial connection thereof are indicated. The source zone 232 forms the source $S_{MOS}$, the drain zone 234 forms the drain $D_{MOS}$, the gate zone 240 forms the gate $G_{MOS}$ and the bulk zone 238 forms the bulk $B_{MOS}$ of the MOS field-effect transistor structure 230. The source zone 262 forms the source $S_{JFET}$, the drain zone 264 forms the drain $D_{JFET}$ and the gate zone 268 forms the gate $G_{JFET}$ of the junction field-effect transistor structure 260.

Figure 2E:
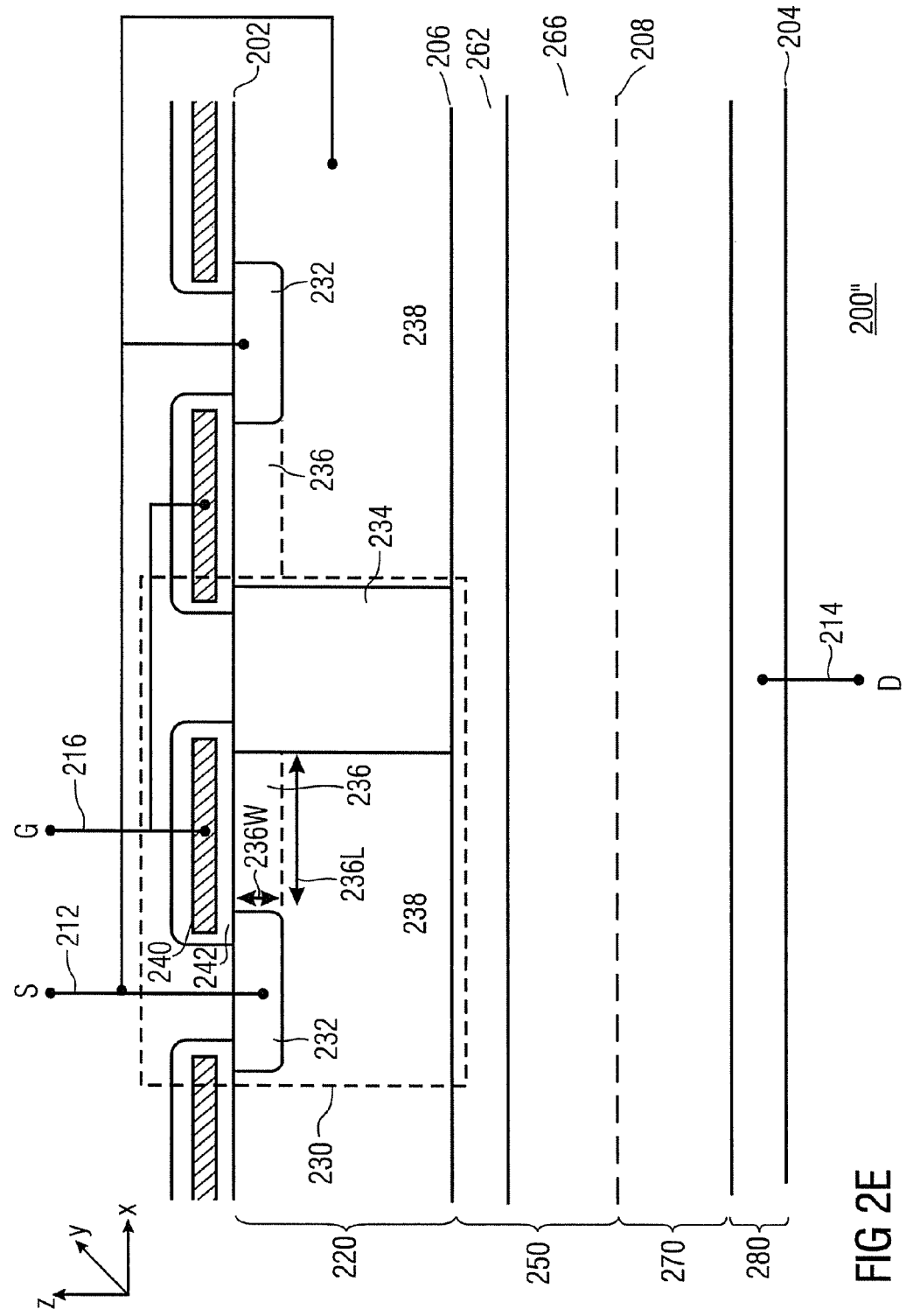
FIG. 2E illustrates a cross section of a third embodiment of a semiconductor device, wherein the source, gate and drain zones of the MOS field-effect transistor are arranged next to one another in stripes and the channel, gate and drain zones of the junction field-effect transistor are also arranged next to one another in stripes, but orthogonal to the stripes of the MOS field-effect transistor.

FIG. 2E illustrates a cross section of a third embodiment of a semiconductor device 200'', wherein the source zone 232, the gate zone 240 and/or the channel zone 236 and the drain zone 234 of the MOS field-effect transistor structure 230 are formed next to one another and in the shape of stripes, i.e. formed next to one another in the x direction and in the shape of stripes in the y direction. The drain zone 262, the channel zone 266 and the gate zones 268 of the junction field-effect transistor structure 260 are also arranged next to one another and in stripes, wherein these are arranged orthogonally to the stripes of the MOS field-effect transistor structure 230, i.e. are arranged next to one another in the y direction and the stripes extending in the x direction.

In addition, the embodiment of FIG. 2E illustrates a third semiconductor region 270 which may in one example be formed as a drift region 270 of a first conductivity type. In other words, the third semiconductor region 270 is arranged between the second semiconductor region 250 and the drain region 280. Corresponding third semiconductor regions 270 may for example also be inserted in embodiments of FIGS. 2A to 2D.

The gate zones 268 only extend to the second boundary level 208 (illustrated by the broken line to explain that the channel zone 266 is illustrated in FIG. 2E and the gate zone 268 is exemplarily arranged behind it in the y direction, i.e. cannot be seen in FIG. 2E).

Figure 2F:
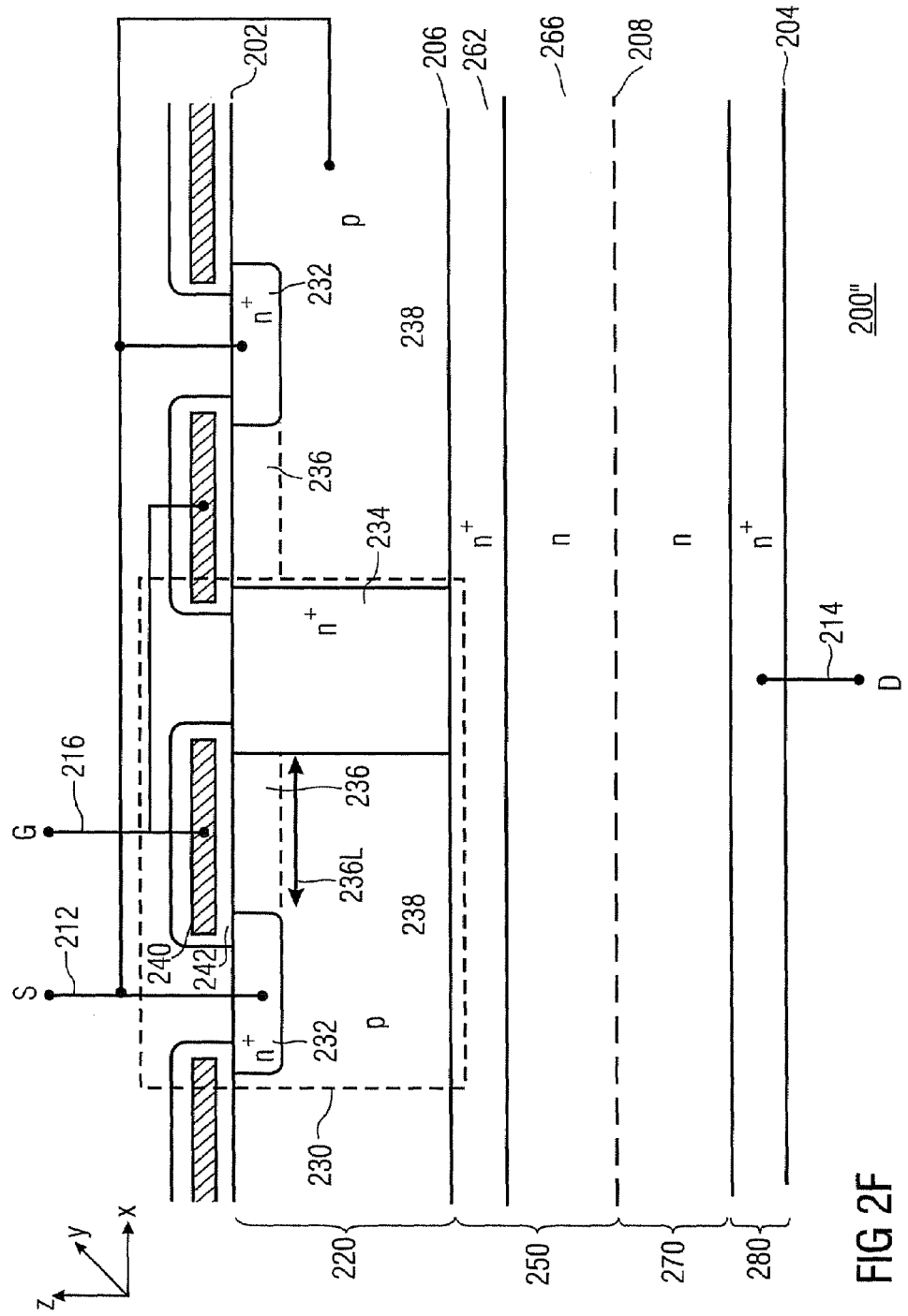
FIG. 2F illustrates the cross section of the third embodiment of the semiconductor device of FIG. 2E, wherein the first conductivity type is an n-type doping and the second conductivity type is a p-type doping.

FIG. 2F illustrates a cross section of an embodiment of FIG. 2E, wherein the first conductivity type generally corresponds to an n-type doping and the second conductivity type corresponds to a p-type doping, irrespective of the doping concentration. The source zone 232, the drain zone 234, the source zone 262 and the drain region 280 have an n$^+$-type doping, the channel zone 266 and the third semiconductor region 270 have an n-type doping, the bulk zone 238 has a p-type doping and the gate zone 268 (not illustrated in FIG. 2F) has a p$^+$-type doping.

Figure 2G:
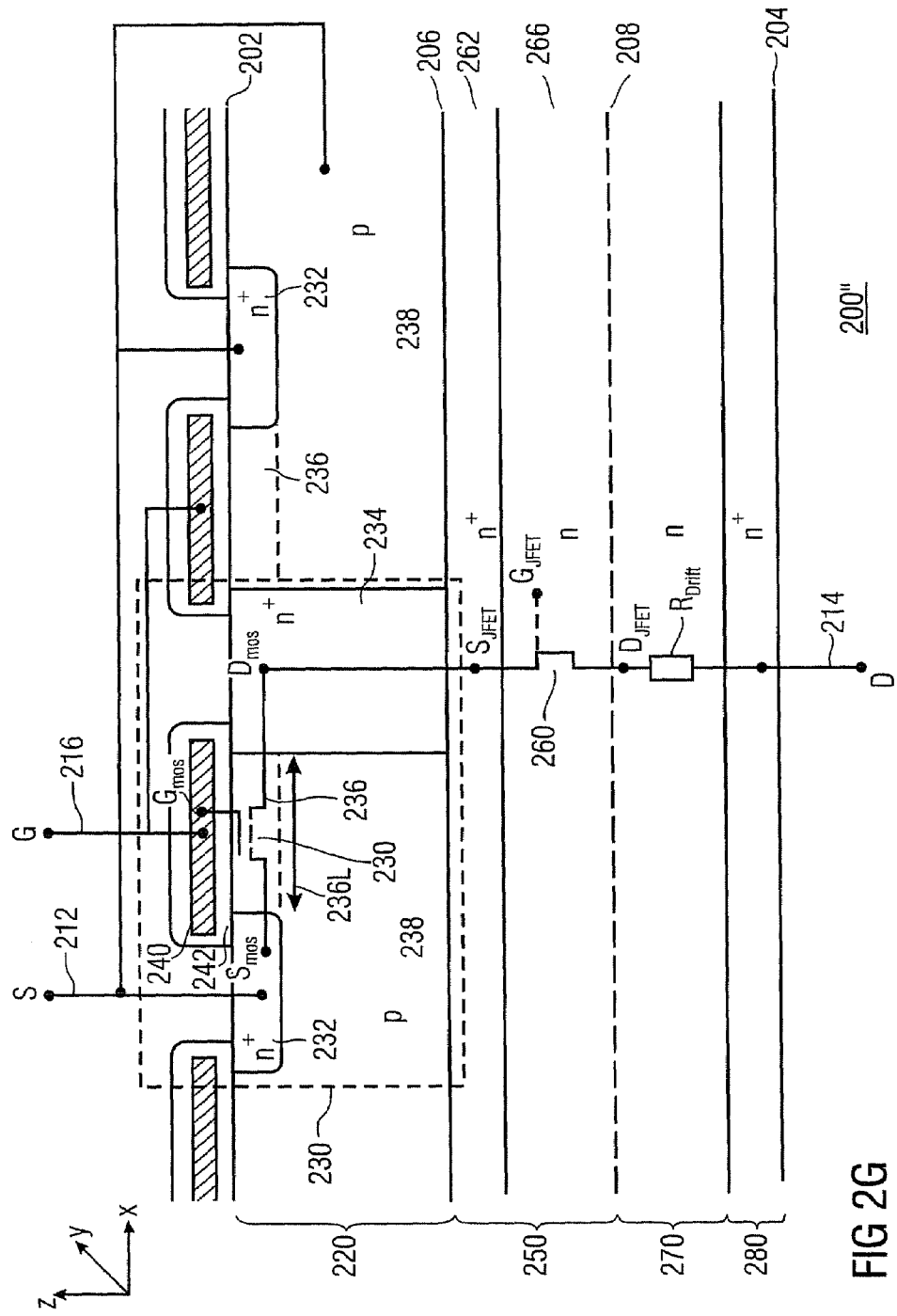
FIG. 2G illustrates the cross section of the third embodiment of the semiconductor device of FIG. 2F and additionally the circuit symbols of the elements which essentially influence the performance of the embodiment.

FIG. 2G illustrates a cross section of FIG. 2F, wherein—in analogy to FIG. 2D—the circuit symbols of the elements determining the voltage and current characteristics of the semiconductor device 200'' are additionally indicated, namely the MOS field-effect transistor structure 230, the junction field-effect transistor structure 260 and additionally the drift region 270 with the corresponding drift resistance $R_{drift}$.

FIG. 3A illustrates a top view of an embodiment, wherein the drain zones, source zones and gate zones and/or channel zones are arranged next to one another in the shape of stripes in a first direction (y direction), like for example already described referring to FIGS. 2E to 2G. FIG. 3A illustrates the stripe-shaped source zones 232 or $S_{MOS}$ arranged next to one another which are connected to the source terminal 212 or S, the gate zones 240 or $G_{MOS}$ connected to the gate terminal 216 or G, and the drain zones 234 or $D_{MOS}$ which are electrically connected to the drain terminal 214 or D of the semiconductor device via the junction field-effect transistor.

Figure 3B:
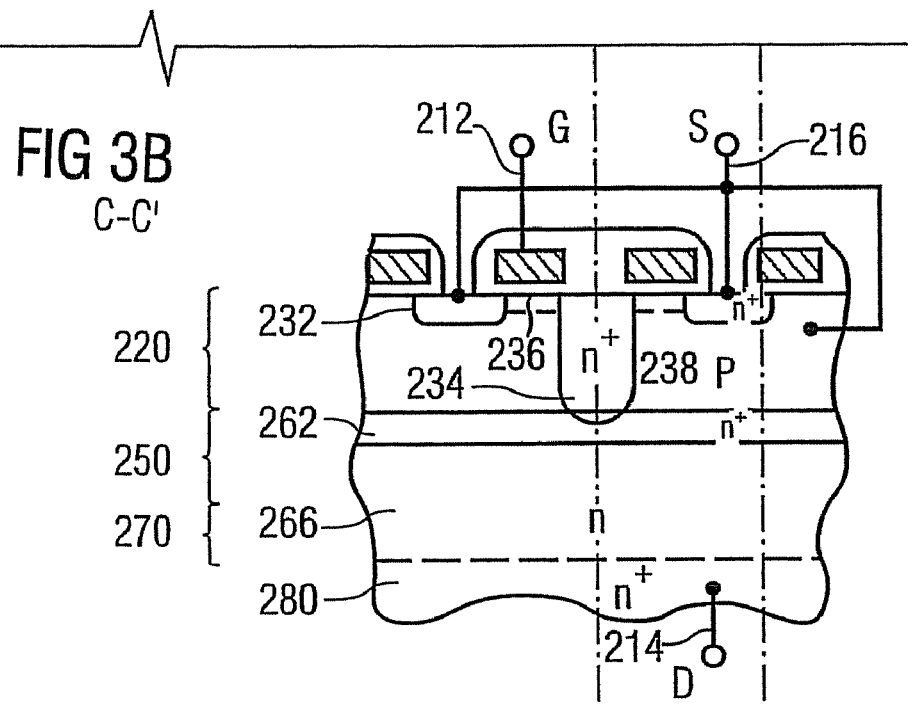
FIG. 3B illustrates a cross section C-C' of the embodiment of FIG. 3A.
Figure 3C:
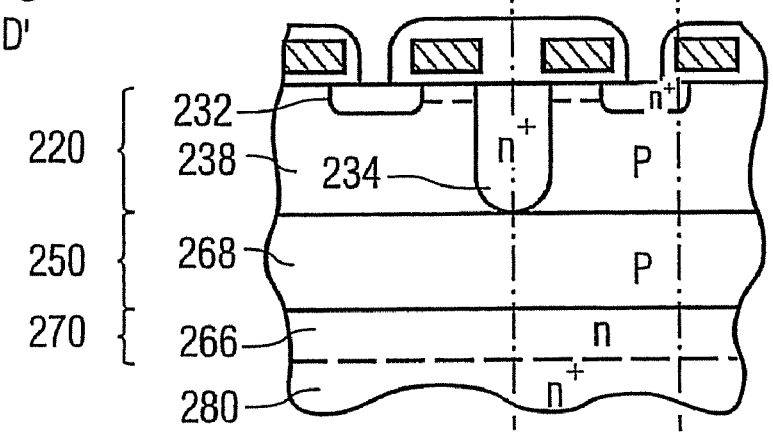
FIG. 3C illustrates a second cross section D-D' of the embodiment of FIG. 3A.

FIG. 3B illustrates a first cross section C-C' of FIG. 3A, FIG. 3C illustrates a second cross section D-D' of FIG. 3A, FIG. 3D illustrates a first longitudinal section A-A' of FIG. 3A, and FIG. 3E illustrates a second longitudinal section B-B' of FIG. 3A.

FIGS. 3B and 3C illustrate the stripe structure of the MOS field-effect transistor structure 230 in the first semiconductor region 220 which is the same in both cross sections. The differences between FIGS. 3B and 3C result from the stripe structure of the junction field-effect transistor structure 260 in the second semiconductor region 250 which is arranged orthogonally to the stripe structure of the MOS field-effect transistor structure 230. Correspondingly, FIG. 3B illustrates the cross section C-C' which, as can be seen from FIGS. 3D and 3E, intersects the junction field-effect transistor structure 260 in the channel region 266, whereas FIG. 3C illustrates a cross section D-D' which, as can be seen from FIGS. 3D and 3E, intersects the junction field-effect transistor structure in the gate zone 268.

Correspondingly, FIG. 3D illustrates the longitudinal section A-A' which, relating to the first semiconductor region 220, passes through the gate zone 240, the source zone 232 (the insulator is not illustrated in FIG. 3D) and the bulk zone 238 which correspondingly extend unchanged over the entire length of FIG. 3B, whereas FIG. 3D clearly illustrates, relating to the second semiconductor region 250, the stripe shape of the junction field-effect transistor structure 250 including the alternating channel zones 266 and/or source zones 262 and the gate zones 266.

FIG. 3E illustrates the second longitudinal section B-B' along the centre of the drain zone 234 of the first semiconductor region, correspondingly the drain zone 232 and/or the first semiconductor region 220 extend unchanged over the entire length of FIG. 3E, whereas, like in FIG. 3D, FIG. 3E also illustrates the corresponding stripe shape of the junction field-effect transistor structure 250.

In the embodiments of FIGS. 2E to 2G and/or 3A to 3E, the channel length of the channel 236 can be dimensioned independently of the channel width and/or channel length of the channel 266.

Additionally, simply contacting of the drain zone 236 to the source zone 262 and the bulk zone 236 to the gate zone 268 is made possible due to the stripe structure.

In one embodiment embodiments in which the first conductivity type is an n-type doping and the second conductivity type is a p-type doping have been described using the above description. In alternative embodiments, the first conductivity type may also be a p-type doping and the second conductivity type may be an n-type doping.

In addition, in embodiments in which the source zone 232, the channel zone 236 and the drain zone 234 of the MOS field-effect transistor structure 230 are arranged next to one another in stripes in a first direction and the gate zone 268 and the channel zone 266 and/or the source zone 262 of the junction field-effect transistor structure are arranged next to one another in stripes in a second direction, the first and second directions may be identical, the first direction and the second direction may be different and/or be in an angle greater than 0° to each other or, according to another embodiment, be in an angle of 90° to each other.

As an alternative to the embodiments having stripe-shaped source, drain, gate and channel zones, different structures, like for example hexagonal structures, may also be used for the MOS field-effect transistor structure in the first semiconductor region and/or the junction field-effect transistor structure in the second semiconductor region.

One or more embodiments of the semiconductor device may include silicon carbide, silicon or any other semiconductor materials as semiconductor material or even more than one semiconductor material.

DMOS transistors of FIGS. 1A to 1C have been described before in which the on-state resistance is basically determined by the resistance components of the MOS switch 180, the junction field-effect transistor component 190 and the drift distance 342. In high-voltage transistors (greater than 200 volts) using silicon as a semiconductor material, the resistance components of the MOS switch 180 and the JFET can frequently be neglected. However, if silicon carbide is used as a semiconductor material, the resistivity of the drift distance 142 decreases dramatically due to the very much higher breakdown value of silicon carbide which is greater by about the factor 10 than that of silicon. At the same time, silicon carbide includes a considerably lower channel mobility of the MOS switch 180 which is also at a factor of 10. This means that the on-state resistance of silicon carbide high-voltage transistors is largely determined by the resistance of the MOS switch 180 and/or channel resistance. It has also been described that in DMOS transistors of FIGS. 1A to 1C the channel widths per unit area of the MOS switch 180 and the JFET 190 cannot be set independently of each other. The MOS switch 180 is in the body region or bulk region 150. Thus, the extensions of these body regions and/or p-regions are very much greater than necessary for the function of the JFET. The body region corresponds to the gate electrodes of the JFET. No MOS switch can be accommodated between the body regions (i.e. in the channel region 192) of the JFET. In order for the channel resistance of the JFET not to become too great, the channel width of the JFET must not be too small, which in turn may require a corresponding dielectric strength of the MOS switch 180 and thus a correspondingly great channel length 184 of the MOS switch 180.

One or more embodiments of the semiconductor device which can also be referred to as "DMOS of maximum channel width" decouple the MOS switch and the junction field-effect transistor and/or JFET geometrically completely from each other. As is illustrated in the embodiments of FIGS. 2A to 2E and/or 3A to 3E, the source zone 232, the gate zone 240 and the drain zone 234 of the MOS switch and/or the MOS field-effect transistor structure 230 can be arranged next to one another directly on the crystalline surface in the densest packing possible, for example in the shape of stripes. The gate electrodes and/or gate zones 268 and the channel and/or channel zones 266 of the junction field-effect transistor can be arranged directly below (exemplarily also in the shape of stripes), but perpendicular to the electrodes and/or zones of the MOS switch 230, in the densest packing possible. The connection between the drain zone 234 of the MOS switch and the source region or source zone 262 of the junction field-effect transistor here may be as is illustrated in FIGS. 2B to 2F and/or 3A to 3E.

The channel width 266W of the channel 266 of the junction field-effect transistor here, at the same resistivity of the junction field-effect transistor 260, can be made considerably smaller as compared to a DMOS of FIGS. 1A to 1C, and nevertheless the pinch-off voltage of the junction field-effect transistor 260 can be reduced to a very much smaller value. Thus, the channel length 236L of the channel 236 of the MOS field-effect transistor 230 can be reduced correspondingly, fulfilling the following condition: pinch-off voltage of the junction field-effect transistor<breakdown voltage of the MOS field-effect transistor. Thus, the packing density of the MOS field-effect transistor 230 in turn can be increased. A channel length of exemplarily 100 nm for example can be realized using modern lithography.

In one or more embodiments, the quantity "channel width/channel length per unit area" of the MOS field-effect transistor may for example be increased by more than one order of magnitude.

In a silicon carbide switch and/or one embodiment of a semiconductor device 200, 200', 200" having SiC as a semiconductor material, the influence of the small channel mobility on the resistance for example can be reduced and at best eliminated.

In further embodiments, the gate electrode 268 of the junction field-effect transistor with a correspondingly reduced doping can reach into the drift distance 270 to achieve a compensation effect like in CoolMOS technology.

In one or more embodiments, the MOS field-effect transistor and the junction field-effect transistor may for example be decoupled such that the channel lengths and widths of the MOS field-effect transistor component and the junction field-effect transistor component and the quantity "channel width/channel length per unit area" can be set independently of one another.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a top surface;
a first lateral semiconductor region arranged adjacent to the top surface and comprising a transistor structure, including a drain zone of a first conductivity type; and
a second lateral semiconductor region arranged below the first semiconductor region and comprising a junction field-effect transistor structure, the junction field-effect transistor structure comprising a source zone of the first conductivity type which is electrically coupled to the drain zone transistor structure, wherein the transistor structure comprises a source zone of a first conductivity type and a channel zone, the source zone and the drain zone of the transistor structure being arranged in the first semiconductor region and spaced apart from each other, and the channel zone being arranged between the source zone and the drain zone of the transistor structure.

2. The semiconductor device of claim 1, comprising wherein the channel zone has a second conductivity type which is inverse to the first conductivity type.

3. The semiconductor device of claim 1, wherein the junction field-effect transistor structure comprises a drain zone and a channel zone of the first conductivity type, and comprises a gate zone of a second conductivity type which is inverse to the first conductivity type, the channel zone being arranged at least partly below the source zone of the junction field-effect transistor structure.

4. A semiconductor device comprising:
a top surface;
a first lateral semiconductor region arranged adjacent to the top surface and comprising a MOS field-effect transistor structure, including a drain zone of a first conductivity type; and
a second lateral semiconductor region arranged below the first semiconductor region and comprising a junction field-effect transistor structure, the junction field-effect transistor structure comprising a source zone of the first conductivity type which is electrically coupled to the drain zone of the MOS field-effect transistor structure, wherein the MOS field-effect transistor structure comprises a source zone of a first conductivity type and a channel zone, the source zone and the drain zone of the MOS field-effect transistor structure being arranged in the first semiconductor region and spaced apart from each other, and the channel zone being arranged between the source zone and the drain zone of the MOS field-effect transistor structure.

5. The semiconductor device of claim 4, comprising wherein the channel zone has a second conductivity type which is inverse to the first conductivity type.

6. The semiconductor device of claim 4, wherein the junction field-effect transistor structure comprises a drain zone and a channel zone of the first conductivity type, and comprises a gate zone of a second conductivity type which is inverse to the first conductivity type, the channel zone being arranged at least partly below the source zone of the junction field-effect transistor structure.

7. The semiconductor device of claim 6, comprising wherein the source zone, the channel zone and the drain zone of the MOS field-effect transistor structure are arranged next to one another in stripes in a first direction, and wherein the channel zone and the gate zone of the junction field-effect transistor structure are arranged next to one another in stripes in a second direction.

8. The semiconductor device of claim 7, comprising wherein the first direction and the second direction are different.

9. The semiconductor device of claim 8, comprising wherein the first direction is orthogonal to the second direction.

10. The semiconductor device of claim 8, wherein the semiconductor device comprises a bottom surface arranged opposite the top surface, and comprises a drain region of the first conductivity type arranged adjacent to the bottom surface, wherein the drain zone of the MOS field-effect transistor structure is electrically connected to the drain region of the semiconductor device via the channel zone of the junction field-effect transistor structure.

11. The semiconductor device of claim 10, wherein the semiconductor device comprises a third lateral semiconductor region of the first conductivity type which is arranged between the second semiconductor region and the drain region.

12. The semiconductor device of claim 4, wherein the first semiconductor region comprises a bulk zone of a second conductivity type inverse to the first conductivity type which basically surrounds the drain zone of the MOS field-effect transistor structure.

13. The semiconductor device of claim 12, comprising a source terminal, the source terminal being electrically connected to the source zone of the MOS field-effect transistor structure and to the bulk zone of the MOS field-effect transistor structure.

14. A semiconductor device comprising:
a top surface;
a first lateral semiconductor region arranged adjacent to the top surface and comprising a MOS field-effect transistor structure, including a drain zone of a first conductivity type; and
a second lateral semiconductor region arranged below the first semiconductor region and comprising a junction field-effect transistor structure, the junction field-effect transistor structure comprising a source zone of the first conductivity type which is electrically coupled to the drain zone of the MOS field-effect transistor structure, wherein the junction field-effect transistor structure and the MOS field-effect transistor structure are implemented such that a pinch-off voltage of the junction field-effect transistor structure is smaller than a breakdown voltage of the MOS field-effect transistor structure.

15. The semiconductor device of claim 4, wherein at least the first semiconductor region and the second semiconductor region comprise the same semiconductor material.

16. The semiconductor device of claim 15, comprising wherein the semiconductor material is silicon carbide (SiC).

17. The semiconductor device of claim 4, comprising wherein the first conductivity type is an n-type doping.

18. A semiconductor device comprising:
  a top surface;
  a first lateral semiconductor region arranged adjacent to the top surface and comprising a MOS field-effect transistor structure, the MOS field-effect transistor structure comprising a drain zone of a first conductivity type, a source zone of the first conductivity type, a channel zone of a second conductivity type which is inverse to the first conductivity type, the channel zone being arranged between the source zone and the drain zone of the MOS field-effect transistor; and
  a second lateral semiconductor region arranged below the first semiconductor region and comprising a junction field-effect transistor structure, the junction field-effect transistor structure comprising a source zone of the first conductivity type, a drain zone of the first conductivity type and a channel zone of the first conductivity type, and a gate zone of the second conductivity type, the channel zone being arranged at least partly below the source zone;
  wherein the source zone of the junction field-effect transistor structure is electrically connected to the drain zone of the MOS field-effect transistor structure; and
  wherein the source zone, the channel zone and the drain zone of the MOS field-effect transistor structure are arranged next to one another in stripes in a first direction, and wherein the channel zone and the gate zone of the junction field-effect transistor structure are arranged next to one another in stripes in a second direction, the first direction being orthogonal to the second direction.

* * * * *